(12) United States Patent
Lee et al.

(10) Patent No.: US 7,834,693 B2
(45) Date of Patent: Nov. 16, 2010

(54) AMPLIFYING CIRCUIT

(75) Inventors: Chao-Cheng Lee, Hsinchu (TW);
Yi-Kuang Chen, Tai Chung (TW)

(73) Assignee: Realtek Semiconductor Corp., Hsinchu (TW)

(*) Notice: Subject to any disclaimer, the term of this patent is extended or adjusted under 35 U.S.C. 154(b) by 64 days.

(21) Appl. No.: 12/136,428

(22) Filed: Jun. 10, 2008

(65) Prior Publication Data
US 2008/0303595 A1 Dec. 11, 2008

(30) Foreign Application Priority Data
Jun. 11, 2007 (TW) .............................. 96120921 A (51) Int. Cl.
*H03F 3/45* (2006.01)
(52) U.S. Cl. ...................... 330/255; 330/261
(58) Field of Classification Search ................. 330/255, 330/261
See application file for complete search history.

(56) References Cited

U.S. PATENT DOCUMENTS

| | | | |
|---|---|---|---|
| 6,657,495 B2 * | 12/2003 | Ivanov et al. | 330/255 |
| 7,057,459 B2 * | 6/2006 | Ueno | 330/255 |
| 7,330,074 B2 * | 2/2008 | Kang et al. | 330/255 |
| 7,414,473 B1 * | 8/2008 | Rayanakorn et al. | 330/255 |
| 2005/0225392 A1 | 10/2005 | Ivanov | |

OTHER PUBLICATIONS

Lewis et al., "A Pipelined 5-Msample/s 9-bit Analog-to-Digital Converter", IEEE Journal of Solid-State Circuits, vol. SC-22, No. 6, pp. 954-961, 1987.
Castello et al., "A High-Performance Micropower Switched-Capacitor Filter", IEEE Journal of Solid-State Circuits, vol. SC-20, No. 6, pp. 1122-1132, 1985.
Eschauzier et al., "A Programmable 1.5V CMOS Class-AB Operational Amplifier with Hybrid Nested Miller Compensation for 120dB Gain and 6 MHz UGF", IEEE International Solid-State Circuits Conference, Session 14, Paper FA 14.2, pp. 246-247, 1994.
Hogervorst et al., "A Compact Power-Efficient 3V CMOS Rail-to-Rail Input/Output Operational Amplifier for VLSI Cell Libraries", IEEE International Solid-State Circuits Conference, Session 14, Paper FA 14.1, pp. 244-245, 1994.

* cited by examiner

*Primary Examiner*—Henry K Choe
(74) *Attorney, Agent, or Firm*—Muncy, Geissler, Olds & Lowe, PLLC (57) ABSTRACT

An amplifier includes: a class AB input stage, receiving an input signal, for generating an inner signal according to the input signal; class AB output stage, includes: a biasing circuit, for providing a first voltage and a second voltage according to the inner signal; and an output stage, for generating an output signal according to the first voltage and the second voltage; wherein a voltage difference between the first voltage and the second voltage generated by the biasing circuit is corresponding to the input signal.

16 Claims, 6 Drawing Sheets

AMPLIFYING CIRCUIT

BACKGROUND OF THE INVENTION

1. Field of the Invention

The present invention relates to an amplifying circuit, and more particularly, to an amplifying circuit with high linearity and low power consumption.

2. Description of the Related Art

As well known by the person of ordinary skilled in the art, input/output stage circuits can be basically divided into three categories, that is, class A circuit, class B circuit, and class AB circuit. Where the performance of class AB circuit falls between the performance of the class A circuit and the class B circuit. In contrast to the class A circuit, the class AB circuit's power consumption is lower. Furthermore, in contrast to the class B circuit, the class AB circuit can provide an improved linear relationship between an amplified signal and an input signal.

For details about the related circuit, please refer to "A Pipelined 5-M Sample 9-bit Analog-to-Digital Converter" published in the December 1987 issue of the JSSC. Another paper titled "A High-performance Micropower Switched-Capacitor Filter" published in the December 1985 issue of the JSSC. Finally, the paper titled "A Programmable 1.5V CMOS Class-AB Operational Amplifier with Hybrid Nested Miller Compensation for 120 dB Gain and 6 MHz UGF" is found in the 1994 edition of the ISSCC.

Figure 1:
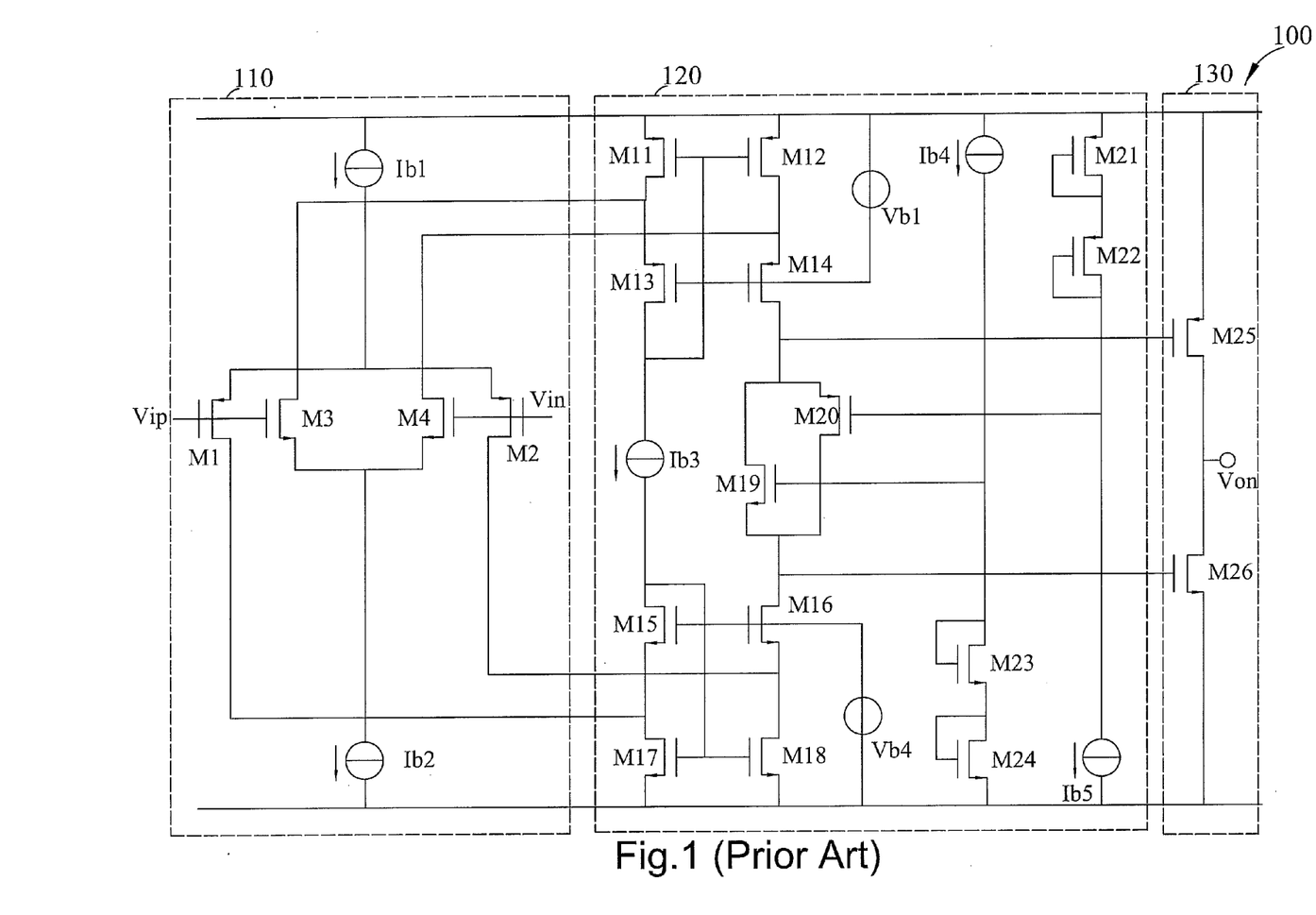
FIG. 1 is a circuit diagram of an operational amplifier according to the prior art.

In the paper titled "A Compact Power-efficient 3V CMOS Rail-to-Rail Input Output Operational Amplifier for VLSI Cell Libraries" published in the ISSSC in 1994, an operational amplifier circuit is disclosed. Please refer to FIG. 1. FIG. 1 is a circuit diagram of an operational amplifier 100 as disclosed in the said ISSSC's 1994 paper. As shown in FIG. 1, the operational amplifier 100 comprises a class A input stage circuit 110, a biasing circuit 120, and an output circuit 130, where the biasing circuit 120 and the output circuit 130 form a class AB output stage circuit.

In reference to FIG. 1, the static current Iq of the output circuit 130 should be appropriately designed such that the entire operational amplifier circuit 100 can be operated at a best operational point when it performs a signal amplifying operation. This means a better linear relationship can be achieved such that the signal will have a larger swing.

Figure 2:
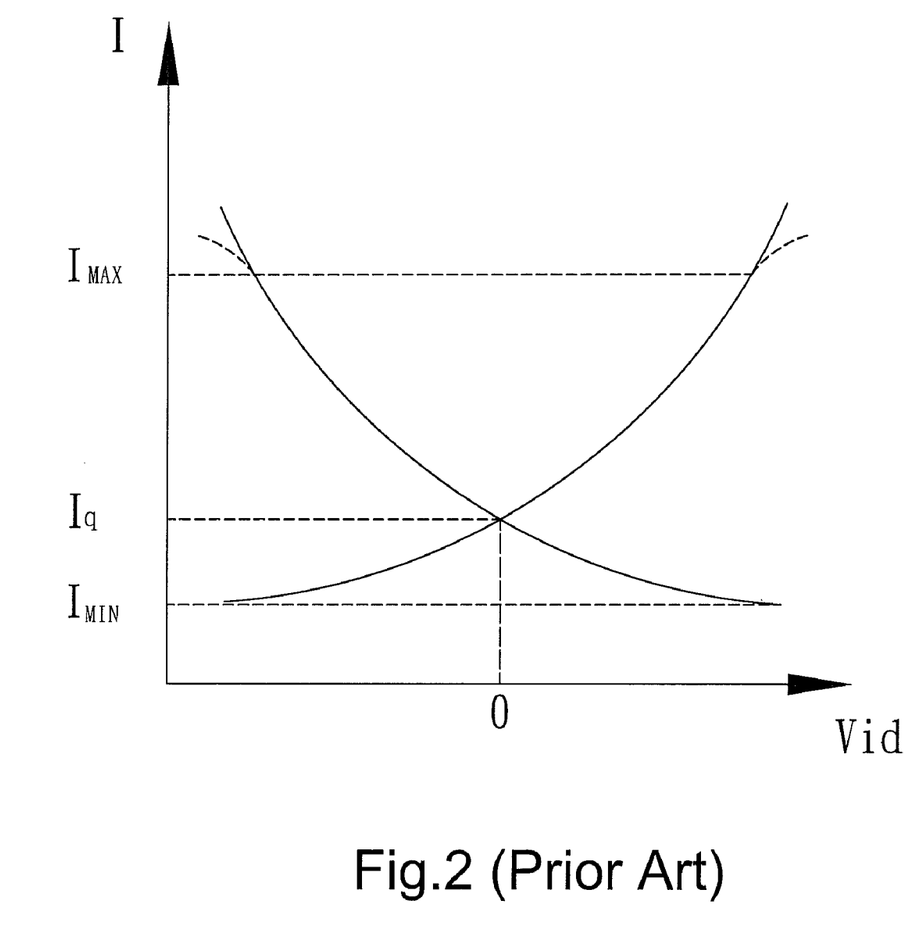
FIG. 2 is a diagram showing a characteristic curve of the output circuit as shown in FIG. 1.

Please refer to FIG. 2. FIG. 2 is a diagram showing a characteristic curve of the output circuit 130 as shown in FIG. 1. In FIG. 2, Iq represents a static current when the input signal is a common-mode voltage (i.e., the differential voltage Vid is 0). $I_{MAX}$ and $I_{MIN}$ represent the maximum and minimum currents sustained by the output circuit 130 under the situation of input signal and output signal still keeping linearity. (That is, the transistors M25 and M26 operated in the saturation region).

As well known by the person of ordinary skilled in the art, in order to make the output signal achieve a maximum swing, the difference between $I_{MAX}$ and $I_{MIN}$ needs to be designed as large as possible. Please note that the swing can be equivalently regarded as an amplified degree without distortions. On the other hand, when there is no input signal (i.e., when the differential voltage Vid is 0), in order to reduce the power consumption, the static current Iq should be designed as small as possible.

However, the above-mentioned circuit cannot obtain the two advantages of amplified degree and the power consumption at the same time. Please note, the above-mentioned circuit uses the class A input stage circuit 110, which indicates that the current from the input stage circuit 110 to the biasing circuit 120 is determined by the current sources Ib1 and Ib2. Therefore, when the gate voltages of the transistor M19 and M20 are determined, the voltage difference $V_{AB}$ between the gate voltages of the transistors M25 and M26 and the static current Iq of the output stage circuit are also correspondingly determined at the same time. In other words, the operational point is determined. Finally, when the input signal is inputted into the operational amplifier 100, the operational point does not change (e.g., the above-mentioned voltage $V_{AB}$ and the static current Iq remain the same).

Therefore, to achieve reduced power consumption of the entire circuit 100, the static current Iq should be set to a smaller value. For example, this can be achieved through setting the gate voltages of the transistors M21 through M24). However, this action also influences the voltage difference $V_{AB}$ between the gate voltages of the transistors M25 and M26 such that the gate voltages of the transistors M25 and M26 are getting higher. In this way, the voltage differences between the gate and the source of the transistors M25 and M26 are also made smaller. As a result, the linearity of the output stage becomes worse and the maximum swing of the output signal is smaller.

Alternatively, if the maximum swing of the output signal is desired to be larger and a better linearity should be needed, the cross voltages of the transistors M21 through M24 should be larger. For example, adjusting the cross voltages of the transistors M21 through M24 to make the voltage difference between the gate and the source of the transistors M25 and M26 lower. However, in this way, when there is no input signal (i.e., the differential voltage Vid is 0), the static current Iq consumes more power.

From the above disclosure, it can be seen the power consumption and the signal swing cannot be optimized at the same time. It is apparent that a solution is needed.

SUMMARY OF THE INVENTION

In view of the above-mentioned problems, an object of the claimed invention is to provide an amplifying circuit, which can have a better linear relationship when an input signal is inputted into the circuit and can have a smaller power consumption when there is no input signal inputted into the circuit, to solve the prior art problems.

According to an embodiment of the claimed invention, an amplifying circuit is disclosed. The amplifying circuit comprises: a class AB input stage circuit, configured to receive an input signal and generating an inner signal according to the input signal; and a class AB output stage circuit, coupled to the class AB input stage, the class AB output stage circuit includes: a biasing circuit, configured to generate a first biasing signal and a second biasing signal according to the inner signal; and an output circuit, for generating an output signal according to the first biasing signal and the second biasing signal; wherein a voltage difference between the first biasing signal and the second biasing signal is corresponding to the input signal.

According to another embodiment of the claimed invention, an amplifying circuit is disclosed. The amplifying circuit comprises: an input stage circuit, configured to receive an input signal and generate a first current signal and a second current signal; an output stage circuit, the output stage circuit includes: a voltage generating circuit, configured to provide a voltage difference according to the first current signal and the second current signal; and an output circuit, configured to generate an output signal according to the voltage difference; wherein a sum of the first current signal and the second current signal is corresponding to a swing of the input signal.

The claimed invention amplifying circuit has better linearity when the input signal is swing, and has smaller power consumption when the input signal is not swing. Therefore, the amplifying circuit of present invention can simultaneously achieve optimized signal amplifying qualities and power consumptions.

DETAILED DESCRIPTION OF THE INVENTION

Figure 3:
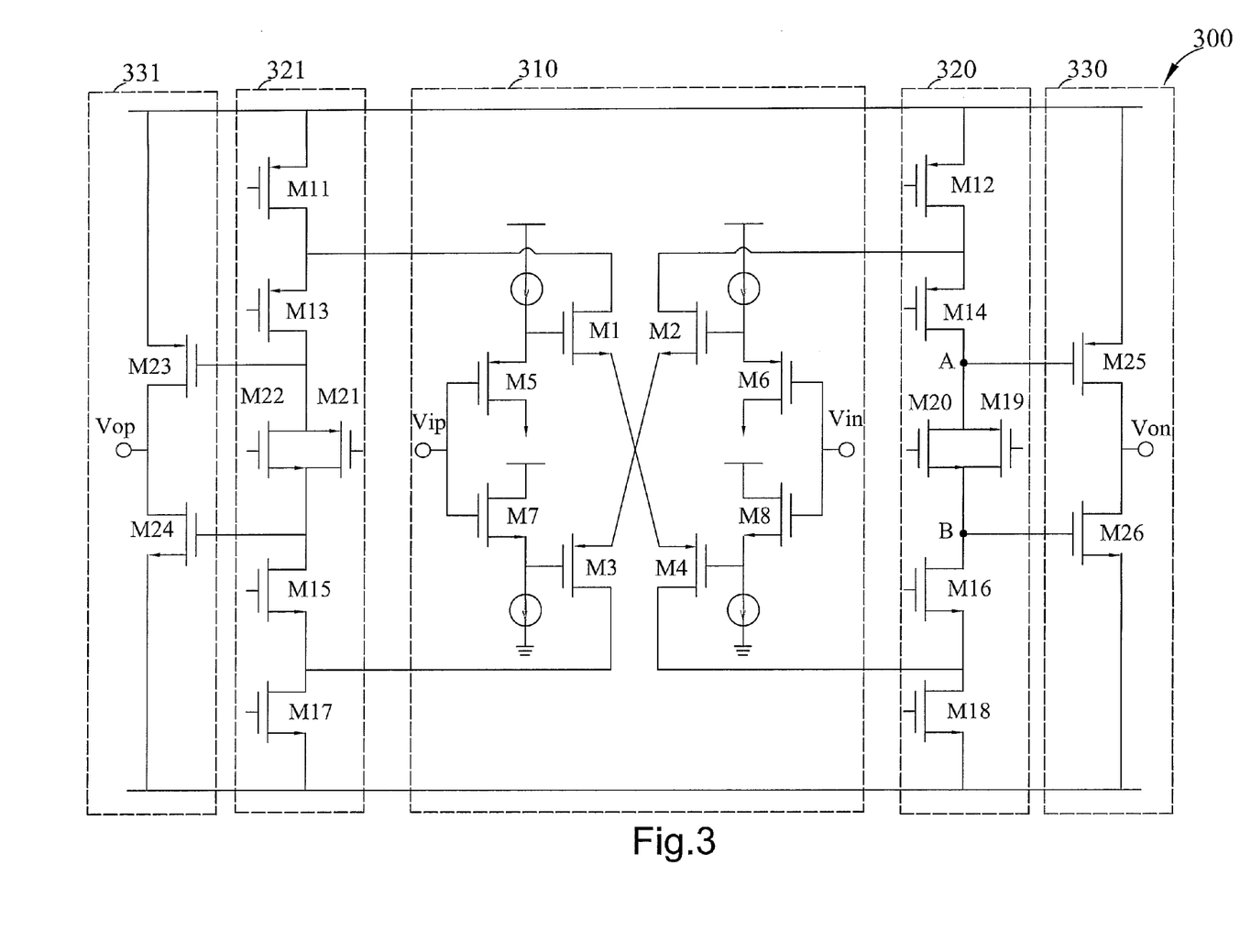
FIG. 3 is a diagram of an operational amplifier according to a first embodiment of the present invention.

Please refer to FIG. 3. FIG. 3 is a diagram of an operational amplifier 300 according to a first embodiment of the present invention. As shown in FIG. 3, the operational amplifier 300 comprises a class AB input stage circuit 310, biasing circuits 320 and 321, and output circuits 330 and 331. Please note, the biasing circuit 320 and the output circuit 330 form a first class AB output stage, and the biasing circuit 321 and the output circuit 331 form a second class AB output stage.

Please note, because the operational amplifier 300 is a differential circuit, in order to help illustrate more simply hereinafter, only half of the operational amplifier 300, specifically those comprising the class AB input stage 310, the biasing circuit 320, and the output circuit 330, are illustrated. The operation and function of the half of the circuit 300 is the same as the other half of the circuit 300, and thus the other half circuit is omitted herein for the sake of brevity and clarity.

As shown in FIG. 3, the output circuit 330 comprises two cascaded transistors M25 and M26 for driving the output end Von. Furthermore, as shown in FIG. 3, the gates (i.e., node A and node B) of the cascaded transistors M25 and M26 are coupled to the biasing circuit 320. Therefore, the biasing circuit 320 can provide an appropriate cross voltage on the gates of the cascaded transistors through the node A and node B.

Figure 4:
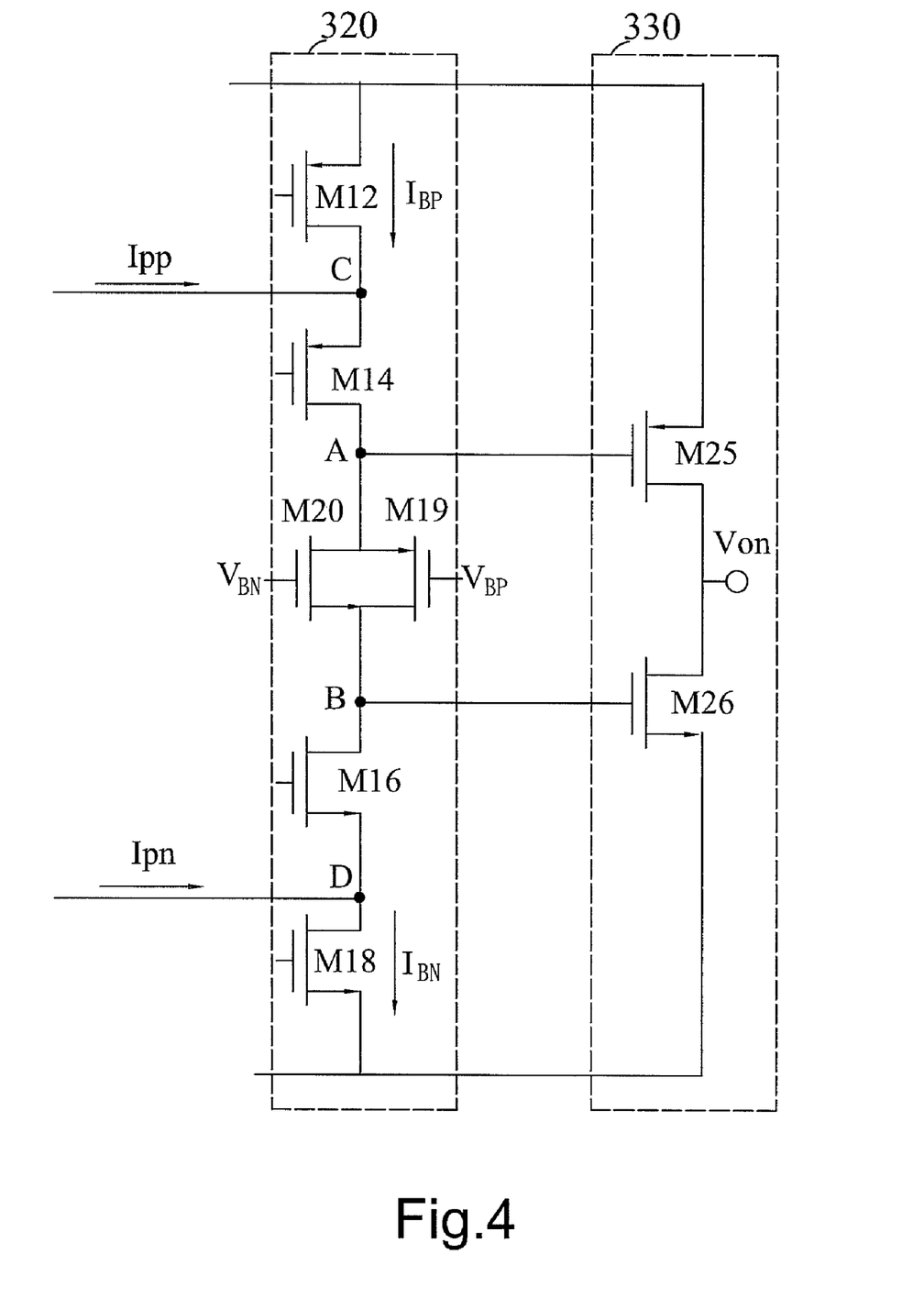
FIG. 4 is a diagram of the class AB output stage circuits as shown in FIG. 3.

Please refer to FIG. 4, which is a diagram of the class AB output stage circuits 320 and 330 shown in FIG. 3. As shown in FIG. 4, the transistors M12 and M18 are utilized as a current source for respectively providing fixed currents $I_{BP}$ and $I_{BN}$. Please note that in FIG. 4, only the transistors M12 and M18 are shown and the other transistors of the current mirror are omitted. The nodes C and D respectively receive current signals $I_{PP}$ and $I_{PN}$ from the class AB input stage 310.

The PMOS transistor M19 and the NMOS transistor M20 form a resistor unit coupled between the nodes A and B. Moreover, the gates of the transistors M19 and M20 are respectively coupled to predetermined voltages $V_{BP}$ and $V_{BN}$. In addition, the transistors M19 and M20 determine their gate-to-source voltage difference (Vgs) according to the current passing through them such that the gate voltages $V_A$ and $V_B$ of the transistors M25 and M26 are determined. Therefore, the circuit designer can appropriately design the currents $I_{BP}$ and $I_{BN}$ or the resistance of the resistor unit (i.e., M19 and M20) to determine an idea voltage difference (e.g., $V_A$ and $V_B$). Furthermore, a resistor can be also be used to replace the transistors M19 and M20 to generate the voltages $V_A$ and $V_B$.

However, please note that the operation and the function of the biasing circuit 320 are different from those of the prior art biasing circuit 120. As mentioned in the prior art, because the current signal outputted from the class A input stage circuit 110 is determined by the current sources Ib1 and Ib2, the sum of the currents $I_{PP}$ and $I_{PN}$ respectively passing through the transistors M19 and M20 does not change according to the input signal. In other words, in the prior art, even the class A input stage 110 receives the differential input signal, the gate voltages $V_A$ and $V_B$ of the transistors M25 and M26 vary in the same amplitude and direction. The voltage difference $V_{AB}$ and the static current Iq do not change, and thus the power consumption and the signal swing cannot be optimized at the same time.

In this embodiment, unlike the prior art, the present invention utilizes the class AB circuit 310 as the input stage. The sum of the currents $I_{PP}$ and $I_{PN}$ vary according to the amplitude of the input differential input signal, therefore, the currents respectively passing through the transistor M19 and M20 vary accordingly such that the voltage difference $V_{AB}$ between the gate voltages of the transistors M25 and M26 change.

From the above disclosure, it can be seen that the voltage difference $V_{AB}$ between the gate voltages of the transistors M25 and M26 change according to the input signal. Therefore, through an appropriate parameter design, the present invention can cause the voltage difference $V_{AB}$ to be larger when the differential input voltage is 0 and thereby reduce the static current Iq of output circuit 330 such that the power consumption of the operational amplifier 300 can be reduced when there is no input signal inputted. On the other hand, when a differential signal is inputted into the operational amplifier 300, the voltage difference $V_{AB}$ can be controlled to be a smaller value through appropriately assigning the sum of the currents outputted from the input stage 310 to the biasing circuit 320 such that the operational amplifier 300 can have a better linearity of the amplified signal and the input signal when the operational amplifier 300 performs an amplifying operation.

In other words, when the input differential voltage is 0, because the sum of the currents $I_{PP}$ and $I_{PN}$ outputted from the class AB input stage 310 to the biasing circuit is a known value, if the gate voltages $V_{BN}$ and $V_{BP}$ of the transistors M19 and M20 (or the current IBP and IBN) are well designed, an optimized static current Iq can be obtained.

On the other hand, when a differential signal is inputted into the operational amplifier 300, because the sum of the currents $I_{PP}$ and $I_{PN}$ outputted from the class AB input stage 310 to the biasing circuit change, if the parameters of the class AB input stage 310 is well designed to make the voltage difference $V_{AB}$ smaller such that the entire circuit 300 can have an optimized linearity.

Figure 5:
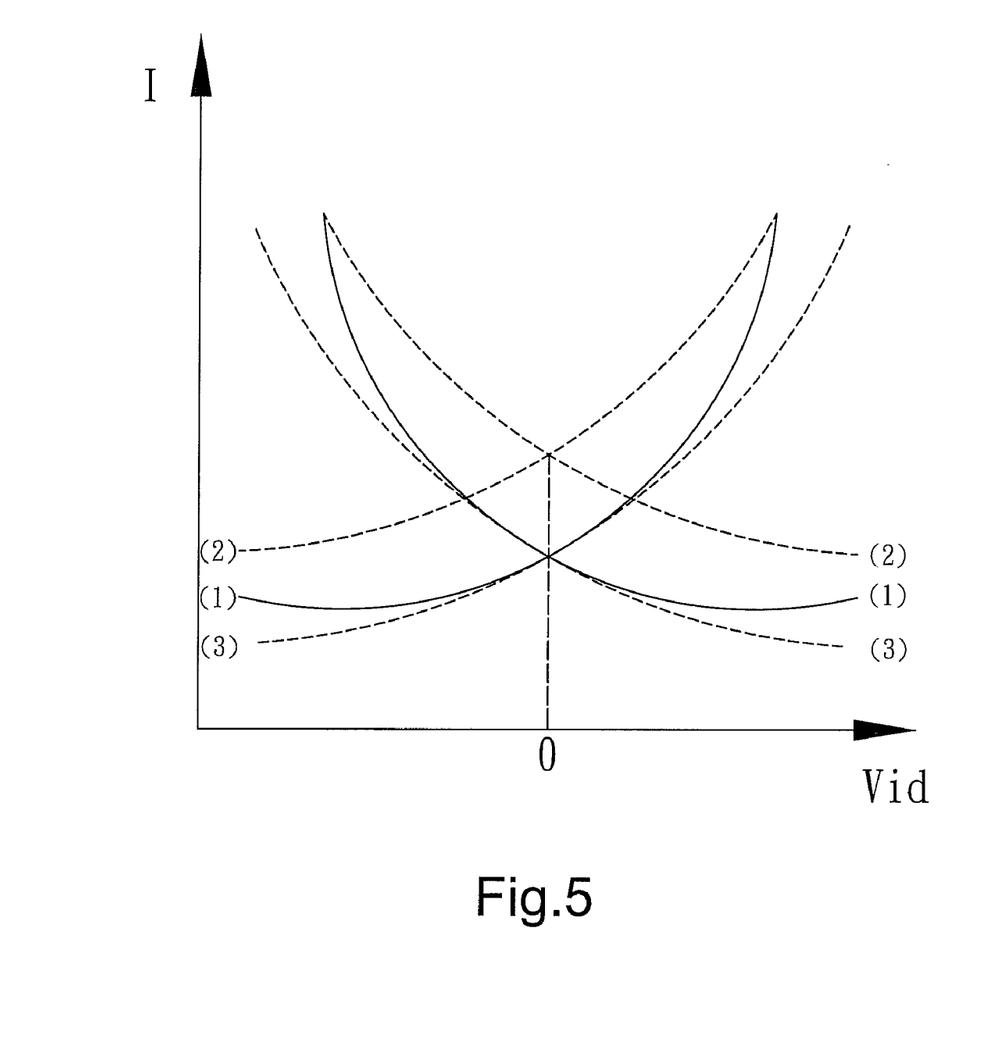
FIG. 5 is a diagram showing the characteristic curves of the present invention output stage circuit and the prior art output stage circuit.

Please refer to FIG. 5. FIG. 5 is a diagram showing the characteristic curves of the present invention output stage circuit 330 and the prior art output stage circuit 130. Please note that in FIG. 5, curve (1) is a characteristic curve of the present invention class AB output stage circuit 330 and curves (2) and (3) are associated with the prior art class AB output stage circuit.

As shown in FIG. 5, in the prior art, if the linearity of the entire circuit should be raised, the curve (3) should be raised to the curve (2). In this way, the static current Iq is also raised to increase the power consumption accordingly.

But, in the curve (1) according to the present invention, it can be seen that the present invention operational amplifier 300 consumes the same static current of curve (3) yet achieves the same linearity (i.e., signal swing) of curve (2). From the above disclosure, it could be known that the present invention operational amplifier 300 can achieve better performance.

Furthermore, as mentioned previously, the biasing current 320 provides the voltage difference $V_{AB}$ according to the sum of the currents, and the sum of currents is generated according to the differential input signal. Therefore, the biasing current 320 can be regarded as changing the output current according to the input signal. The above-mentioned mechanism is called "feed-forward biasing." In contrast to the prior art's local feedback biasing mechanism, the above-mentioned feed-forward biasing mechanism is not required to reference the feedback signal and can therefore be operated at a greater speed.

Figure 6:
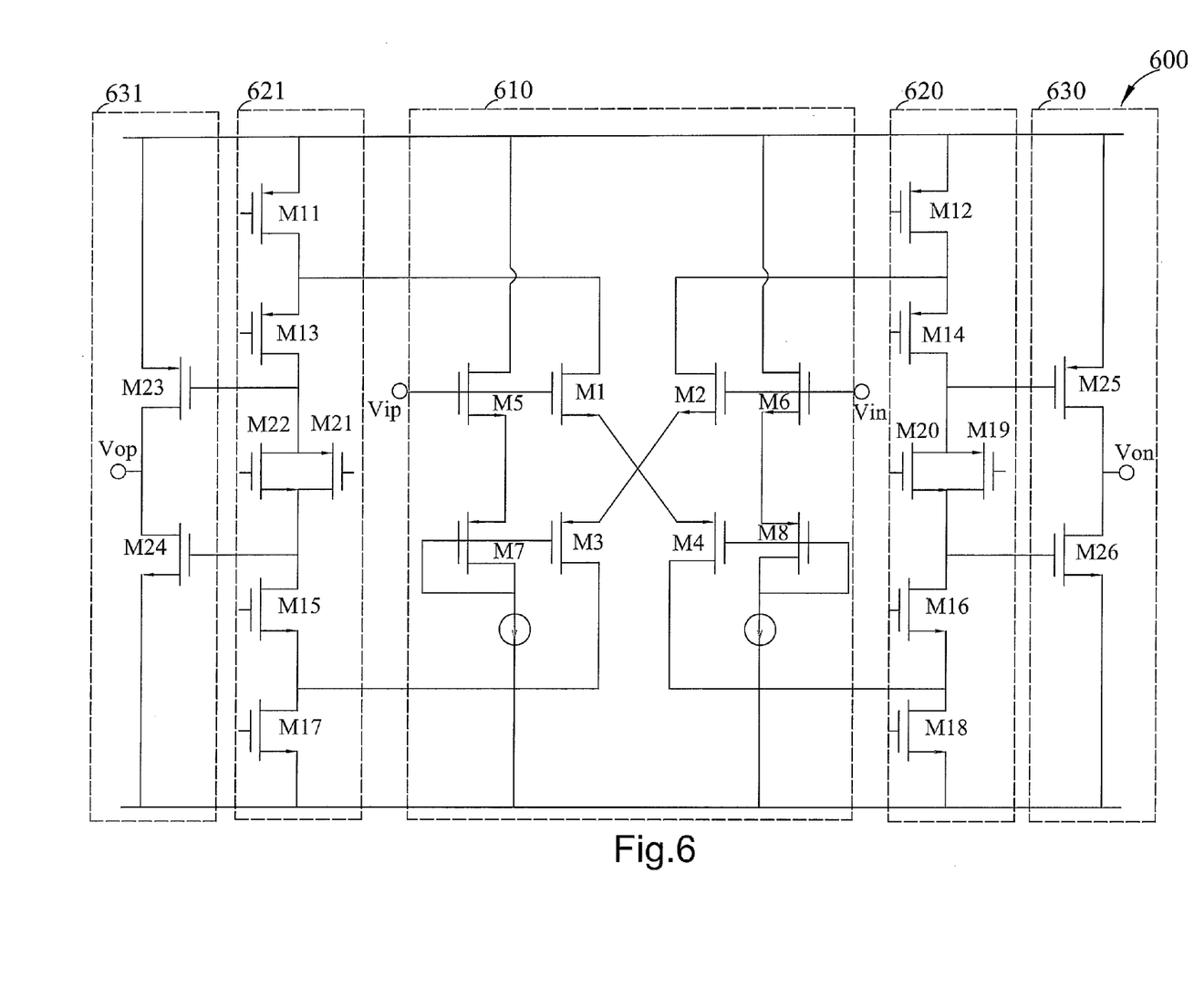
FIG. 6 is a diagram of an operational amplifier according to a second embodiment of the present invention.

Please refer to FIG. 6. FIG. 6 is a diagram of an operational amplifier 600 according to a second embodiment of the present invention. As shown in FIG. 6, the operational amplifier 600 comprises a class AB input stage 610, biasing circuits 620 and 621, and output circuits 630 and 631.

Please note, the difference between the second embodiment and the first embodiment is that in the second embodiment the transistors M5 through M8 of the class AB input stage 610 are coupled as a diode to provide an appropriate bias to the inner transistors M1 through M4 of the class AB input stage 610. The other circuits are all the same as those of the first embodiment of the operational amplifier 300 and have similar operations and functions, therefore, they are omitted herein for the sake of brevity.

In contrast to the prior art, the amplifying circuit of the present invention has an improved linear relationship when the input signal swing, and reduced (i.e., improved) power consumption when input signal is not swing. Therefore, the present invention amplifying circuit can simultaneously achieve optimized signal amplifying qualities and power consumption.

While certain exemplary embodiments have been described and shown in the accompanying drawings, it is to be understood that such embodiments are merely illustrative of and not restrictive on the broad invention, and that this invention is not limited to the specific construction and arrangement shown and described, since various other modifications may occur to those ordinarily skilled in the art.

What is claimed is:

1. A circuit, comprising:
   a class AB input stage circuit, for receiving an input signal and generating an inner signal according to the input signal; and
   a class AB output stage circuit, coupled to the class AB input stage circuit, comprising:
      a biasing circuit, for generating a first biasing signal and a second biasing signal according to the inner signal; and
      an output circuit, coupled to the biasing circuit, for generating an output signal according to the first biasing signal and the second biasing signal;
   wherein a voltage difference between the first biasing signal and the second biasing signal is corresponding to the input signal; and
   the biasing circuit comprises:
      a first current source, for providing a first predetermined current;
      a second current source, for providing a second predetermined current; and
      a resistor unit, coupled between the first current source and the second current source, for generating the first biasing signal and the second biasing signal according to the first predetermined current and the second predetermined current.

2. The circuit of claim 1, wherein the biasing circuit generates the first biasing signal and the second biasing signal by forward biasing.

3. The circuit of claim 1, wherein the output circuit comprises a first and a second cascaded transistors.

4. The circuit of claim 3, wherein the first transistor is a PMOS transistor, the second transistor is an NMOS transistor, and a gate of the first transistor and a gate of the second transistor respectively receive the first biasing signal and the second biasing signal.

5. The circuit of claim 1, wherein the resistor unit comprises:
   a NMOS transistor, a gate of the NMOS transistor receiving a first predetermined voltage; and
   a PMOS transistor, a gate of the PMOS transistor receiving a second predetermined voltage;
   wherein a source of the PMOS transistor is coupled to a drain of the NMOS transistor and a drain of the PMOS transistor is coupled to a source the NMOS transistor.

6. The circuit of claim 1, wherein the input signal is a differential signal, the inner signal comprises a first current signal and a second current signal flowing into the biasing circuit, and a sum of the first current signal and the second current signal is corresponding to a differential voltage of the differential signal.

7. The circuit of claim 1, being utilized in an operational amplifier.

8. A circuit, comprising:
   an input stage circuit, receiving an input signal for generating a first current signal and a second current signal;
   an output stage circuit, coupled to the input stage circuit, the output stage circuit comprising:
      a voltage generating circuit, coupled to the input stage circuit, providing a voltage difference according to the first current signal and the second current signal; and
      an output circuit, coupled to the voltage generating circuit, for generating an output signal according to the voltage difference;
   wherein a sum of the first current signal and the second current signal is corresponding to a swing of the input signal; and
   the biasing circuit comprises:
   a first current source, providing a first predetermined current;
   a second current source, providing a second predetermined current; and
   a resistor unit, coupled between the first current source and the second current source, for generating the voltage difference according to the first predetermined current, the second predetermined current, the first current signal and the second current signal.

9. The circuit of claim 8, wherein the voltage generating circuit generates the voltage difference by forward biasing.

10. The circuit of claim 8, wherein the output circuit comprises a first and a second cascaded transistor.

11. The circuit of claim 10, wherein the first transistor is a PMOS transistor, the second transistor is an NMOS transistor, and a gate of the first transistor and a gate of the second transistor respectively receive the first biasing signal and the second biasing signal.

12. The circuit of claim 8, wherein the resistor unit comprises:
- an NMOS transistor, a gate of the NMOS transistor receiving a first predetermined voltage; and
- a PMOS transistor, a gate of the PMOS transistor receiving a second predetermined voltage;
- wherein a source of the PMOS transistor is coupled to a drain of the NMOS transistor, and a drain of the PMOS transistor is coupled to a source the NMOS transistor.

13. The circuit of claim 8, wherein the input stage circuit is a class AB input stage circuit.

14. The circuit of claim 8, wherein the output stage circuit is a class AB output stage circuit.

15. The circuit of claim 8, wherein the input signal is a differential signal, and the swing is a differential voltage of the differential signal.

16. The circuit of claim 8, being utilized in an operational amplifier.

* * * * *